United States Patent
Pan et al.

(10) Patent No.: US 10,210,984 B2
(45) Date of Patent: Feb. 19, 2019

(54) ELECTRONIC APPARATUS

(71) Applicant: BOTHHAND ENTERPRISE INC., Tainan (TW)

(72) Inventors: Yung-Ming Pan, Taoyuan (TW); Chung-Cheng Fan, Taoyuan (TW)

(73) Assignee: BOTHHAND ENTERPRISE INC., Tainan (TW)

( * ) Notice: Subject to any disclaimer, the term of this patent is extended or adjusted under 35 U.S.C. 154(b) by 439 days.

(21) Appl. No.: 15/224,690

(22) Filed: Aug. 1, 2016

(65) Prior Publication Data
US 2017/0278615 A1    Sep. 28, 2017

(30) Foreign Application Priority Data
Mar. 24, 2016   (TW) .............................. 105109107 A

(51) Int. Cl.
| | | |
|---|---|---|
| *H01F 17/00* | (2006.01) | |
| *H01F 27/00* | (2006.01) | |
| *H01F 27/29* | (2006.01) | |
| *H05K 5/00* | (2006.01) | |
| *H01F 27/02* | (2006.01) | |
| *H01F 27/24* | (2006.01) | |
| *H01F 27/28* | (2006.01) | |
| *H03H 7/01* | (2006.01) | |
| *H05K 5/02* | (2006.01) | |
| *H05K 5/03* | (2006.01) | |

(52) U.S. Cl.
CPC ........... *H01F 27/02* (2013.01); *H01F 27/027* (2013.01); *H01F 27/24* (2013.01); *H01F 27/2823* (2013.01); *H01F 27/29* (2013.01); *H03H 7/17* (2013.01); *H05K 5/0065* (2013.01); *H05K 5/0247* (2013.01); *H05K 5/03* (2013.01)

(58) Field of Classification Search
CPC ...... H01F 27/027; H01F 27/29; H05K 5/0065
See application file for complete search history.

(56) References Cited

U.S. PATENT DOCUMENTS 5,656,985 A * 8/1997 Lu .......................... H01F 27/027
 174/561
7,060,611 B1 * 6/2006 Lin .......................... H01F 41/10
 438/660

(Continued)

FOREIGN PATENT DOCUMENTS

TW   M497651 U  *  3/2015  ............. B65D 85/90

*Primary Examiner* — Mang Tin Bik Lian
*Assistant Examiner* — Malcolm Barnes
(74) *Attorney, Agent, or Firm* — Kirton McConkie; Evan R. Witt

(57) ABSTRACT

An electronic apparatus includes a base including a surrounding wall defining first and second receiving spaces and having first and second end surfaces, and an electronic module including a terminal unit, and first and second electronic units respectively received in the first and second receiving spaces. The terminal unit includes two first terminals connected to the first electronic unit, two second terminals connected to the second electronic unit, and two connecting terminals, each of which has first and second sections respectively extending from the first and second end surfaces and connected to the first and second electronic units, and an interconnecting section embedded within the base and interconnecting the first and second sections.

7 Claims, 10 Drawing Sheets

(56) References Cited

U.S. PATENT DOCUMENTS

| | | | |
|---|---|---|---|
| 7,670,183 B2* | 3/2010 | Huang | H01R 13/6633 439/620.05 |
| 7,948,771 B2* | 5/2011 | Zhang | H05K 5/0091 361/809 |
| 2010/0134228 A1* | 6/2010 | Chow | H01F 27/027 336/92 |
| 2011/0095847 A1* | 4/2011 | Chen | H01F 17/062 333/175 |
| 2013/0178104 A1* | 7/2013 | Lin | H01R 9/22 439/626 |

* cited by examiner

ELECTRONIC APPARATUS

CROSS-REFERENCE TO RELATED APPLICATION

This application claims priority of Taiwanese Patent Application No. 105109107, filed on Mar. 24, 2016.

FIELD

The disclosure relates to an electronic apparatus.

BACKGROUND

Referring to FIGS. 1 and 2, a conventional electronic apparatus 1 disclosed in U.S. patent application Ser. No. 14/885,529 includes a base 11, and an electronic module 10 that is mounted to the base 11. The electronic module 10 includes a terminal unit 12, a first electronic unit 13 and a second electronic unit 14. The base 11 includes a surrounding wall 112 that has opposite first and second wall sections 113, 114, and that defines a receiving space 111. The terminal unit 12 includes two first terminals 121 that are mounted to the first wall section 113 of the surrounding wall 112, two second terminals 122 that are mounted to the second wall section 114 of the surrounding wall 112, a first grounding terminal 123 that is mounted to the second wall section 114, a second grounding terminal 124 that is mounted to the first wall section 113, and two connecting terminals 125 that are mounted to the second wall section 114.

The first electronic unit 13 and the second electronic unit 14 are received in the receiving space 111. The first electronic unit 13 includes a first winding core 131, a conducting wire 132 that is wound on the first winding core 131, and a first connecting wire 133 that is wound on the first winding core 131. The conducting wire 132 has two wire sections each connected to a respective one of the first terminals 121 and the second grounding terminal 124. The first connecting wire 133 has two wire sections each connected to a respective one of the connecting terminals 125 and the first grounding terminal 123. The second electronic unit 14 includes a second winding core 141, and two second connecting wires 142 that are wound on the second winding core 141. Each of the second connecting wires 142 is connected to a respective one of the second terminals 122 and a respective one of the connecting terminals 125.

When assembling the conventional electronic apparatus 1, the process of winding the conducting wire 132 and the first connecting wire 133 to the first winding core 131, and the process of winding the second connecting wires 142 to the second winding core 141 can be conducted at the same time, thereby reducing the total amount of time for assembling the conventional electronic apparatus 1. Nonetheless, since all of the first terminals 121, the second terminals 122, the first grounding terminal 123, second grounding terminal 124 and the connecting terminals 125 protrude from the base 11 in the same direction, it is difficult and time-consuming for a user to connect each wire to the correct terminal.

SUMMARY

Therefore, an object of the present disclosure is to provide an electronic apparatus that can alleviate at least one of the drawbacks associated with the prior art.

According to the present disclosure, an electronic apparatus includes a base and an electronic module.

The base includes a surrounding wall and a separating wall that is connected to the surrounding wall. The surrounding wall and the separating wall cooperatively define a first receiving space and a second receiving space that are spaced apart from each other by the separating wall. The surrounding wall has opposite first and second end surfaces that are formed with the first and second receiving spaces, respectively.

The electronic module includes a terminal unit that is mounted to the base, a first electronic unit that is received in the first receiving space, and a second electronic unit that is received in the second receiving space. The terminal unit includes two first terminals that are electrically connected to the first electronic unit, two second terminals that are electrically connected to the second electronic unit, and two connecting terminals that are mounted to the base. Each of the connecting terminals has a first section that extends outwardly from the first end surface and that is electrically connected to the first electronic unit, a second section that extends outwardly from the second end surface and that is electrically connected to the second electronic unit, and an interconnecting section that is embedded in the base, that extends through the separating wall, and that interconnects the first section 361 and the second section 362.

BRIEF DESCRIPTION OF THE DRAWINGS

Other features and advantages of the present disclosure will become apparent in the following detailed description of the embodiment(s) with reference to the accompanying drawing, of which.

DETAILED DESCRIPTION

Figure 1:
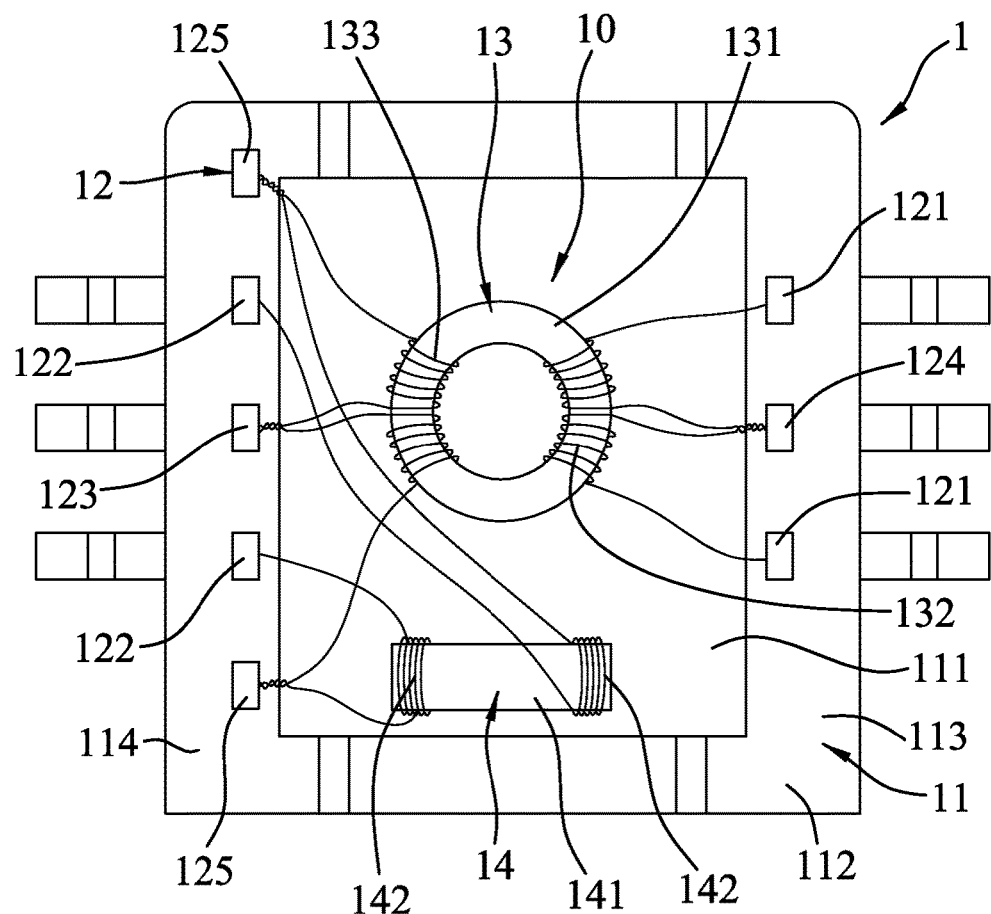
FIG. 1 is a top view of a conventional electronic apparatus disclosed in U.S. patent application Ser. No. 14/885,529.
Figure 2:
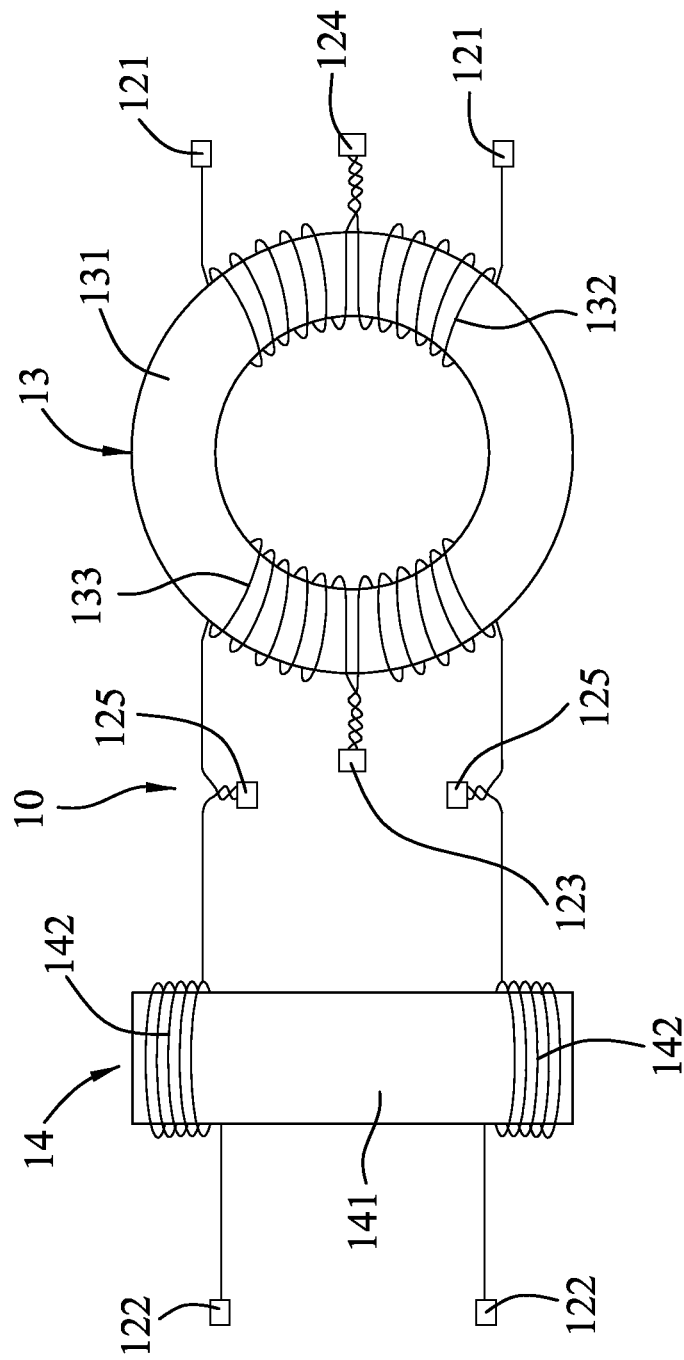
FIG. 2 is a schematic view showing the wiring of the conventional electronic apparatus.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 3:
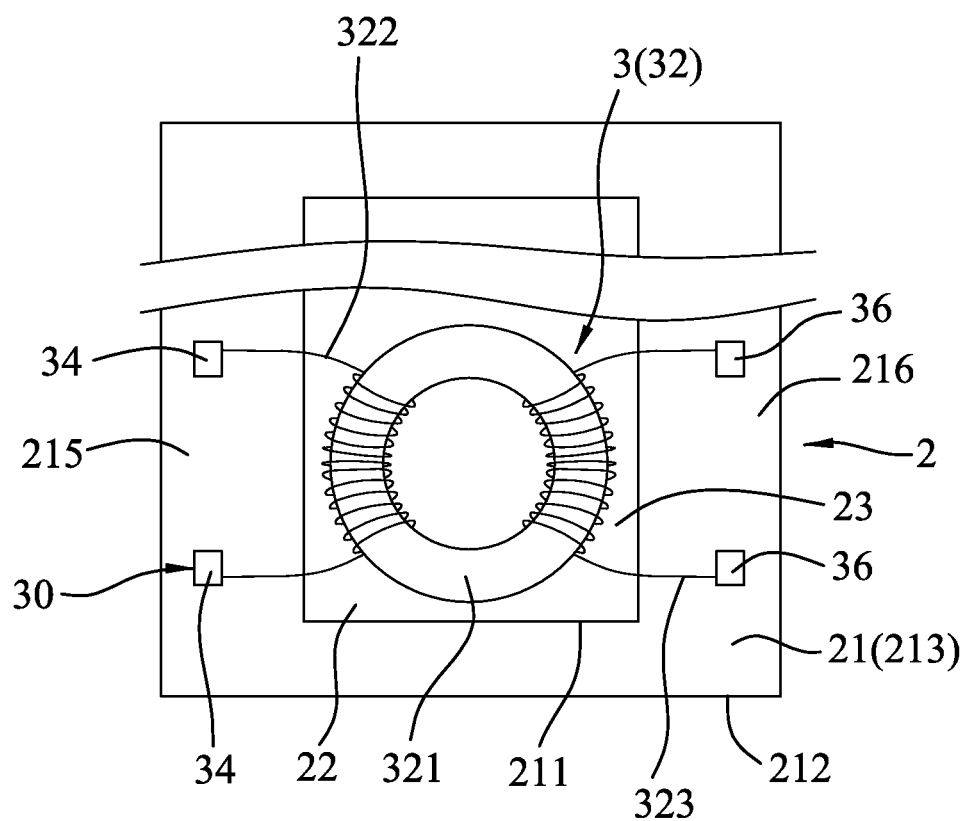
FIG. 3 is a top view of a first embodiment of an electronic apparatus according to the present disclosure.
Figure 4:
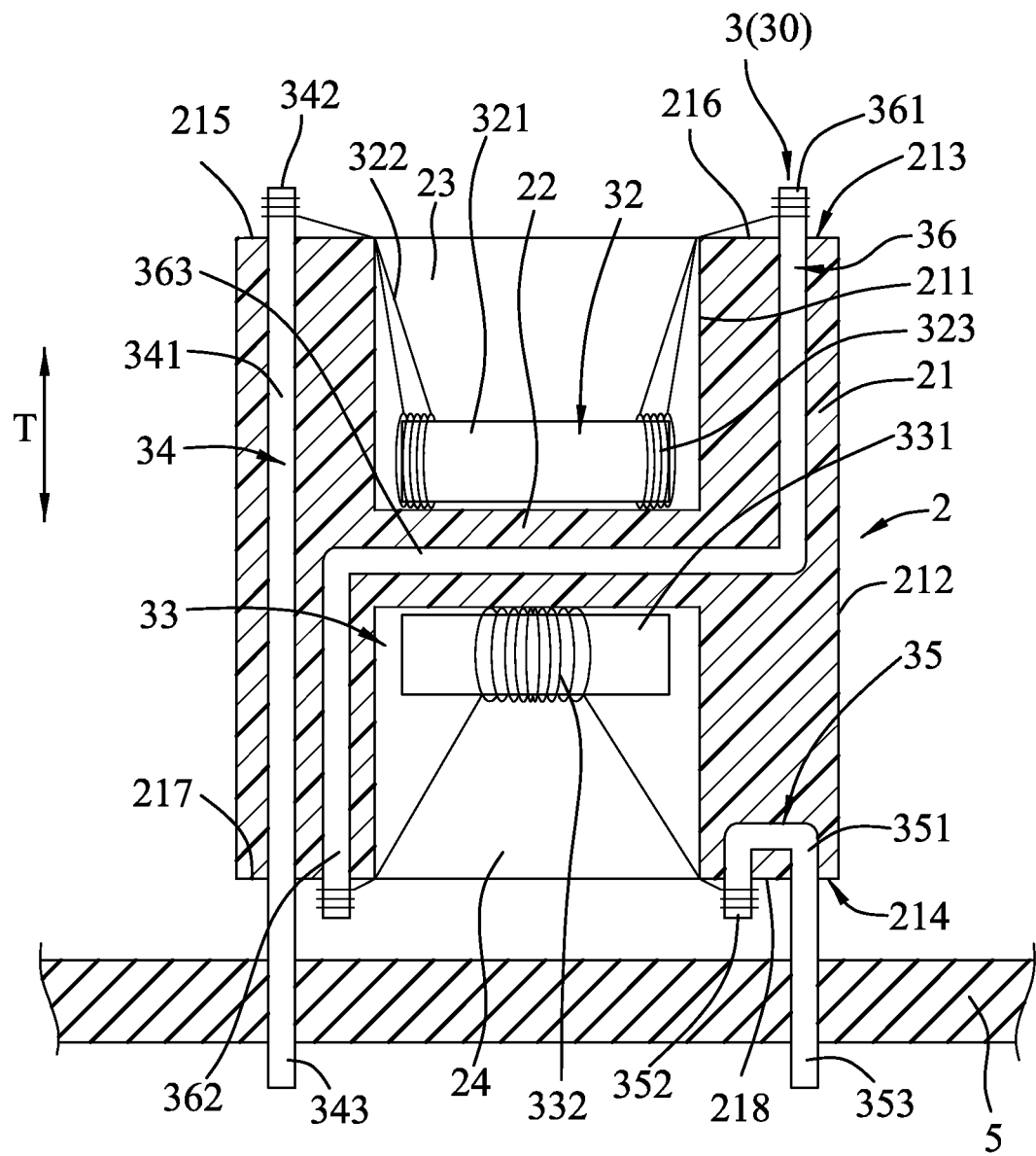
FIG. 4 is a partly sectional view of the first embodiment that is mounted to a circuit board.
Figure 5:
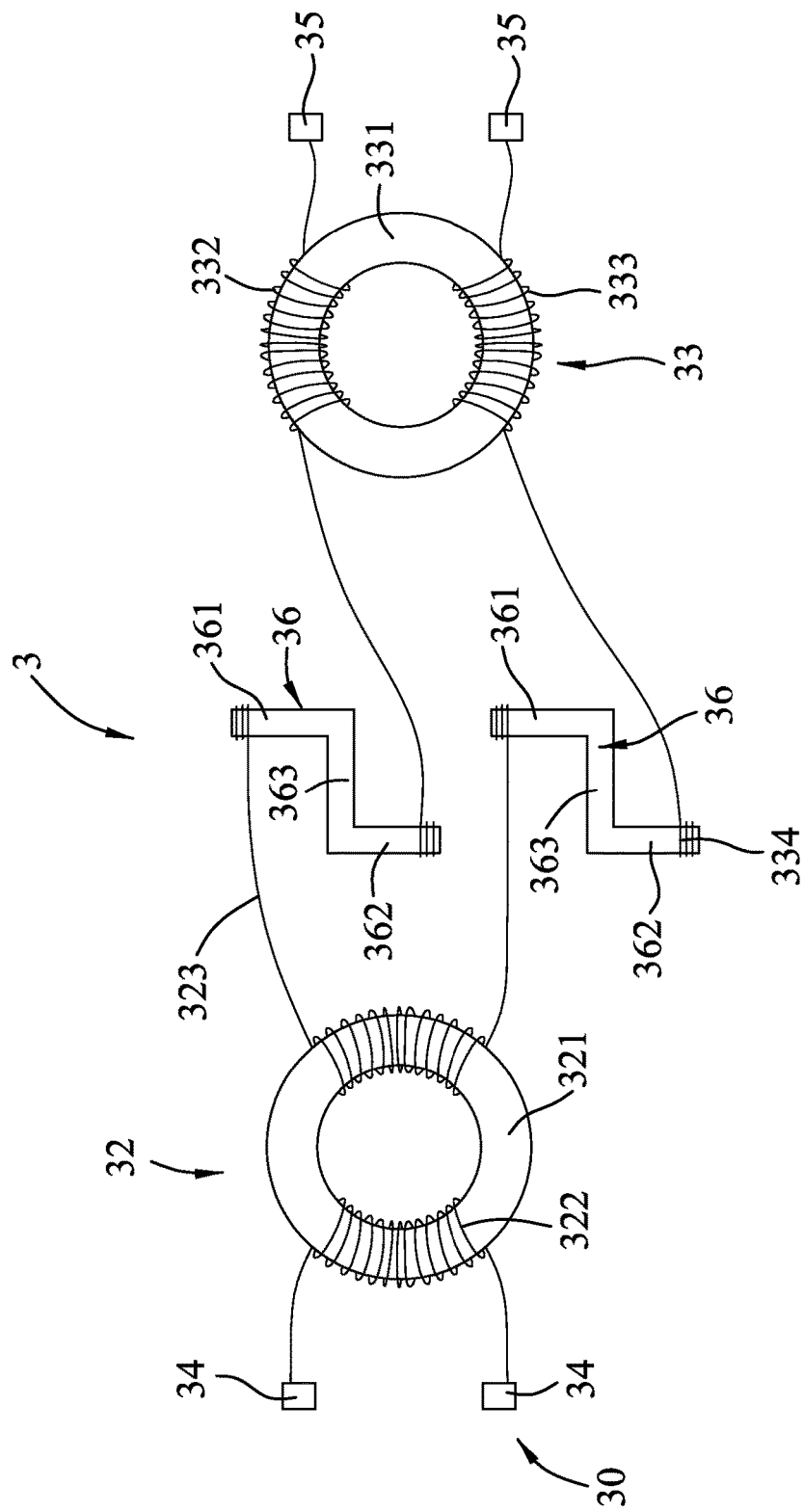
FIG. 5 is a schematic view showing the wiring of the first embodiment.

Referring to FIGS. 3 to 5, a first embodiment of an electronic apparatus according to the present disclosure may be configured to function as a wave filter, a transformer, or a filter-transformer-dual-function apparatus. The different functions can be achieved by changing components of the electronic apparatus, which is well-known in the art, and therefore will not be further elaborated for the sake of brevity.

The first embodiment of the electronic apparatus includes a base 2 and at least one electronic module 3 that is mounted to the base 2. In practical use, the electronic apparatus often includes multiple electronic modules 3. However, the electronic modules 3 all have the same structure, and therefore only one is further described hereinafter.

The base 2 includes a surrounding wall 21 that is configured as, for example but not limited to, a rectangular shape. The surrounding wall 21 has an inner surrounding surface 211, opposite first and second end surfaces 213, 214 interconnected by the inner surrounding surface 211, and an outer surrounding surface 212 that extends perpendicularly from the first end surface 213 to the second end surface 214 and that interconnects the first end surface 213 and the second end surface 214. The base 2 further includes a separating wall 22 that is connected to the inner surrounding surface 211 of the surrounding wall 21. The surrounding wall 21 and the separating wall 22 cooperatively define a first receiving space 23 and a second receiving space 24 that are spaced apart from each other by the separating wall 22. The first and second end surfaces 213, 214 are formed with the first and second receiving spaces 23, 24, respectively. The first end surface 213 of the surrounding wall 21 has a first surface region 215 and a second surface region 216 that are respectively located at opposite sides of the first receiving space 23. The second end surface 214 of the surrounding wall 21 has a third surface region 217 and a fourth surface region 218 that are respectively located at opposite sides of the second receiving space 24. The first surface region 215 of the first end surface 213 and the third surface region 217 of the second end surface 214 correspond in position to each other along a thickness direction (T) of the separating wall 22. The second surface region 216 of the first end surface 213 and the fourth surface region 218 of the second end surface 214 correspond in position to each other along the thickness direction (T) of the separating wall 22.

The electronic module 3 includes a terminal unit 30 that is mounted to the base 2, a first electronic unit 32 that is received in the first receiving space 23, and a second electronic unit 33 that is received in the second receiving space 24. The terminal unit 30 includes two first terminals 34 that are electrically connected to the first electronic unit 32, two second terminals 35 that are electrically connected to the second electronic unit 33, and two connecting terminals 36 that are mounted to the base 2.

Each of the first terminals 34 has a first embedded section 341 that is embedded within the surrounding wall 21, a first protruding section 342 that is connected to the first embedded section 341 and that extends outwardly from the first surface region 215 of the first end surface 213, and a first inserting section 343 that is connected to the first embedded section 341 and that extends outwardly from the third surface region 217 of the second end surface 214. Each of the second terminals 35 has a second embedded section 351 that is embedded within the surrounding wall 21, a second protruding section 352 that is connected to the second embedded section 351 and that extends outwardly from the fourth surface region 218 of the second end surface 214, and a second inserting section 353 that is connected to the second embedded section 351 and that extends outwardly from the fourth surface region 218 of the second end surface 214. Each of the connecting terminals 36 has a first section 361 that extends outwardly from the second surface region 216 of the first end surface 213 and that is electrically connected to the first electronic unit 32, a second section 362 that extends outwardly from the third surface region 217 of the second wall surface 214 and that is electrically connected to the second electronic unit 33, and an interconnecting section 363 that is embedded within the base 2, that extends through the separating wall 22, and that interconnects the first section 361 and the second section 362.

In the first embodiment, the electronic apparatus is electrically connected to a circuit board 5 through a through-hole technology. As can be seen from FIG. 4, the first inserting section 343 of each of the first terminals 34 and the second inserting section 353 of each of the second terminals 35 are inserted through the circuit board 5.

The first electronic unit 32 may be configured as an electronic coil, and includes a first winding core 321, a first connecting wire 322 that is wound on the first winding core 321 and that is electrically connected to the first protruding sections 342 of the first terminals 34, and a second connecting wire 323 that is wound on the first winding core 321 and that is electrically connected to the first sections 361 of the connecting terminals 36. It is noted that, when the length of the first connecting wire 322 is the same as that of the second connecting wire 323, the first electronic unit 32 functions as a wave filter. On the other hand, when the length of the first connecting wire 322 is different from that of the second connecting wire 323, the first electronic unit 32 functions as a transformer.

The second electronic unit 33 may be configured as an electronic coil, and includes a second winding core 331, a third connecting wire 332 that is wound on the second winding core 331 and that is electrically connected to one of the second sections 362 of the connecting terminals 36 and one of the second protruding sections 352 of the second terminals 35, and a fourth connecting wire 333 that is wound on the second winding core 331 and that is electrically connected to the other one of the second sections 362 of the connecting terminals 36 and the other one of the second protruding sections 352 of the second terminals 35. It is noted that, when the length of the third connecting wire 332 is the same as that of the fourth connecting wire 333, the second electronic unit 33 functions as a wave filter. On the other hand, when the length of the third connecting wire 332 is different from that of the fourth connecting wire 333, the second electronic unit 33 functions as a transformer.

The first electronic unit 32 and the second electronic unit 33 are individually manufactured, and then are respectively placed into the first receiving space 23 and the second receiving space 24. Since the first protruding sections 342 of the first terminals 34 and the first sections 361 of the connecting terminals 36 all protrude from the first end surface 213, and each protrudes from a corresponding one of the first surface region 215 and the second surface region 216 of the first end surface 213, an user can easily connect the wires of the first electronic unit 32 to the correct terminals, thereby increasing manufacturing efficiency and reducing the possibility of incorrect connection. Similarly, since the second protruding sections 352 of the second terminals 35 and the second sections 362 of the connecting terminals 36 all protrude from the second wall surface 214, and each protrudes from a corresponding one of the third surface region 217 and the fourth surface region 218 of the second wall surface 214, the user can easily connect the wires of the second electronic unit 33 to the correct terminals. Moreover, the first protruding sections 342 of the first terminals 34 and the first sections 361 of the connecting terminals 36 are located proximate to an opening of the first receiving space 23, and the second protruding sections 352 of the second terminals 35 and the second sections 362 of the connecting terminals 36 are located proximate to an opening of the second receiving space 24, thereby facilitating speedy and correct wire connection of the first electronic unit 32 and the second electronic unit 33.

Figure 6:
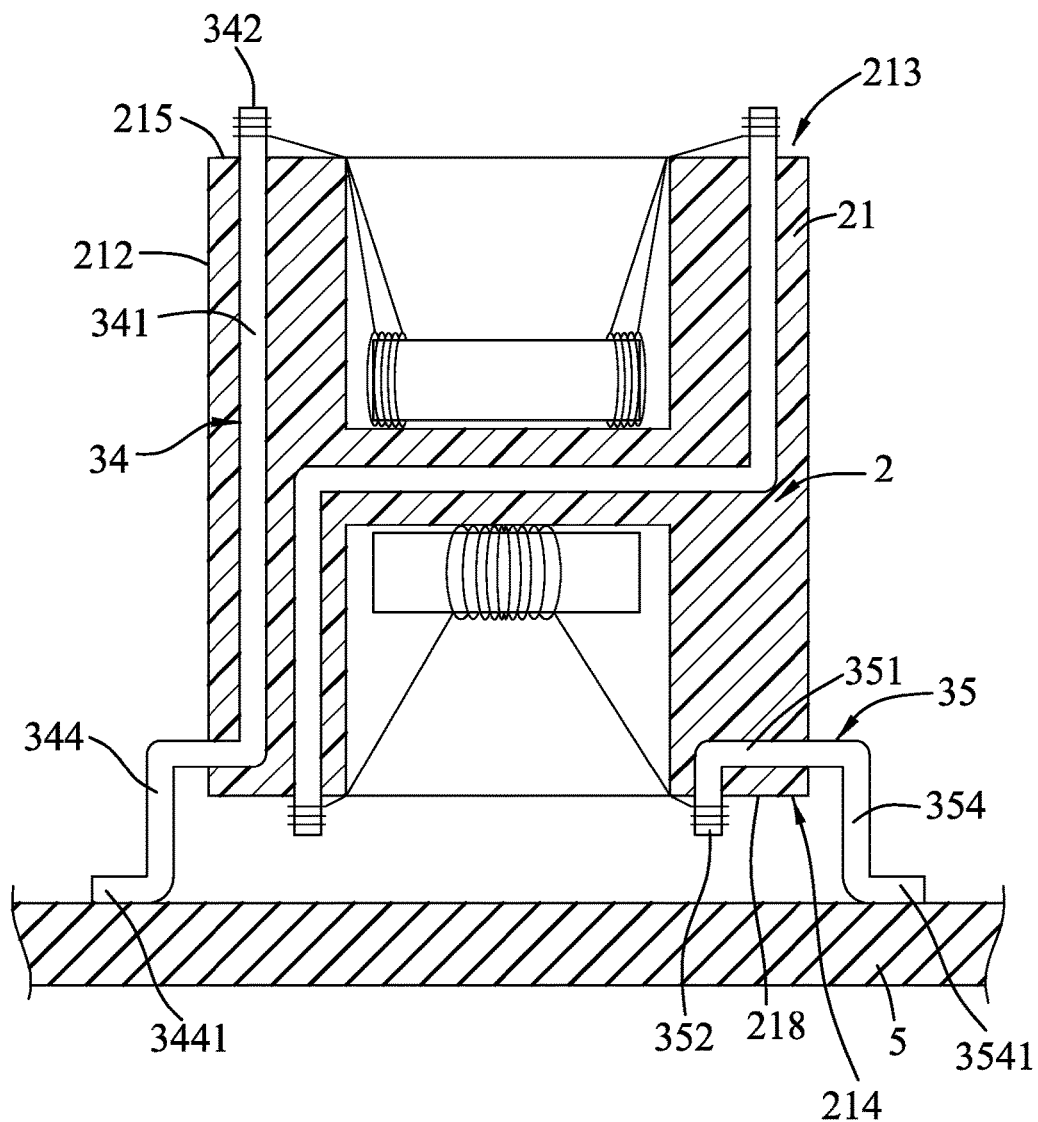
FIG. 6 is a partly sectional view of a second embodiment of the electronic apparatus according to the present disclosure, which is mounted to the circuit board.

Referring to FIG. 6, a second embodiment of the electronic apparatus of the present disclosure has a structure similar to that of the first embodiment, except for the structures of the first terminals 34 and the second terminals 35. In the second embodiment, each of the first terminals 34 has a first embedded section 341 that is embedded within the surrounding wall 21, a first protruding section 342 that is connected to the first embedded section 341 and that extends outwardly from the first surface region 215 of the first end surface 213, and a first connecting section 344 that is connected to the first embedded section 341 and that extends outwardly from the outer surrounding surface 212 of the surrounding wall 21. Each of the second terminals 35 has a second embedded section 351 that is embedded within the surrounding wall 21, a second protruding section 352 that is connected to the second embedded section 351 and that extends outwardly from the fourth surface region 218 of the second end surface 214, and a second connecting section 354 that is connected to the second embedded section 351 and that extends outwardly from the outer surrounding surface 212 of the surrounding wall 21.

In the second embodiment, the electronic apparatus is electrically connected to the circuit board 5 though a surface-mount technology. Each of the first connecting section 344 of each of the first terminals 34 and the second connecting section 354 of each of the second terminals 35 has a contact end portion 3441, 3541 being in contact with and extending substantially parallel to the circuit board 5, so that the electronic apparatus can be fixedly and steadily mounted to the circuit board 5.

Figure 7:
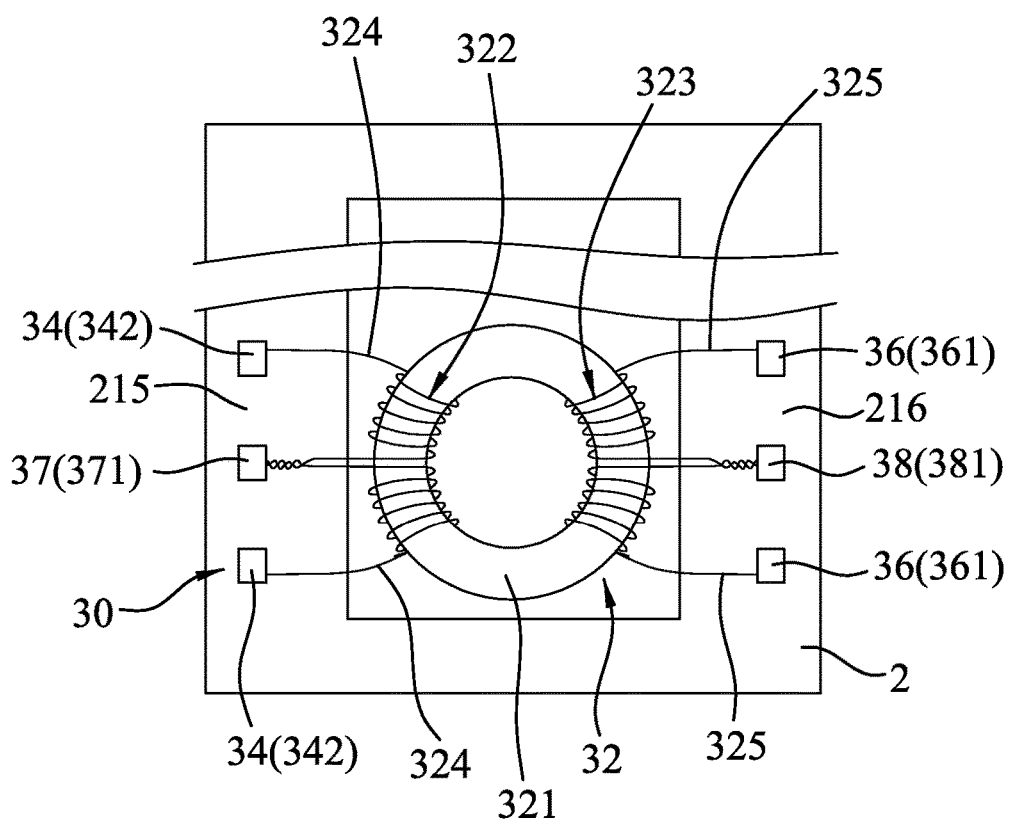
FIG. 7 is a top view of a third embodiment of the electronic apparatus according to the present disclosure.
Figure 8:
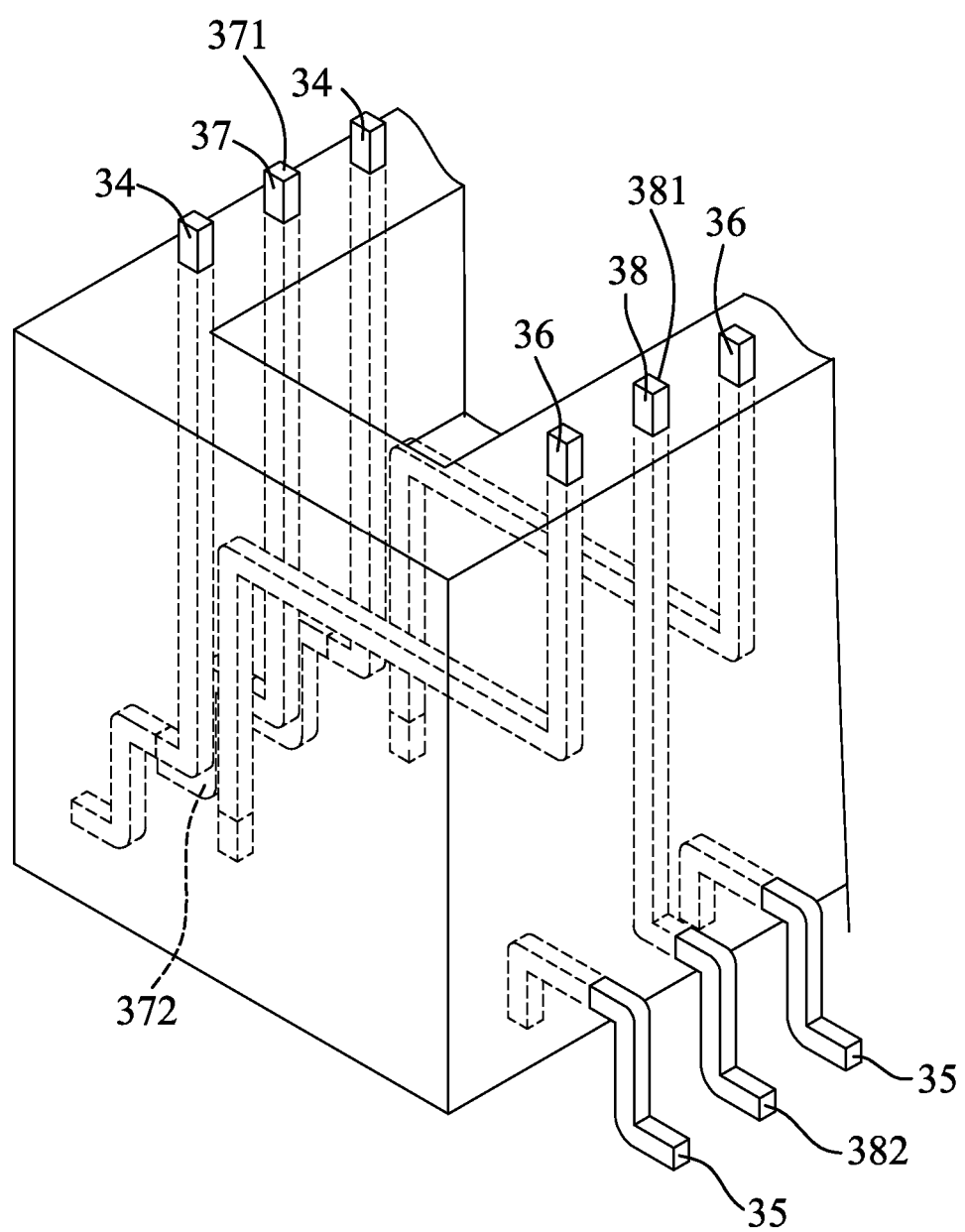
FIG. 8 is a fragmentary schematic view of the third embodiment, showing the structures of two first terminals, two second terminals, two connecting terminals, a first grounding terminal and a second grounding terminal of a terminal unit of the third embodiment.
Figure 9:
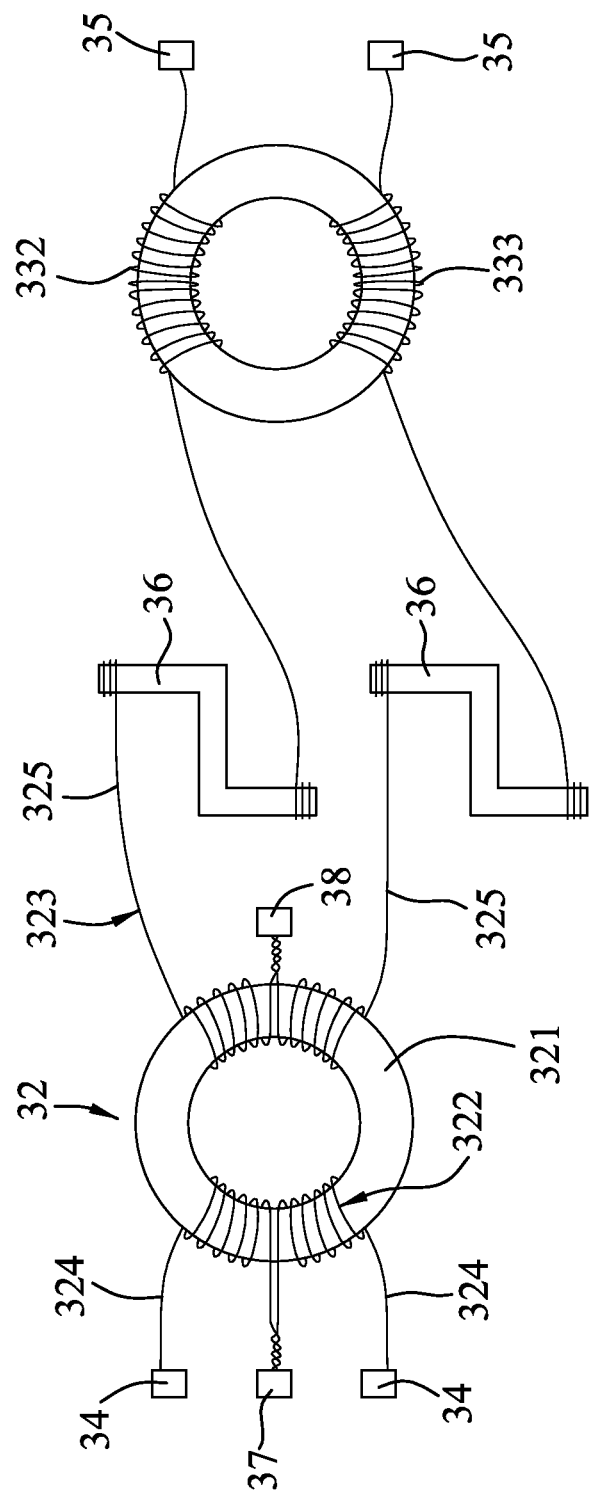
FIG. 9 is a schematic view showing the wiring of the third embodiment.

Referring to FIGS. 7 to 9, a third embodiment of the electronic apparatus of the present disclosure has a structure similar to that of the second embodiment, except that the third embodiment is configured to have a function of grounding. In the third embodiment, the terminal unit 30 further includes a first grounding terminal 37 that has a first end 371 extending outwardly from the first surface region 215 of the first end surface 213 and a second end 372 extending outwardly from the outer surrounding surface 212 of the surrounding wall 21, and a second grounding terminal 38 that has a first end 381 extending outwardly from the second surface region 216 of the first end surface 213 and a second end 382 extending outwardly from the outer surrounding surface 212 of the surrounding wall 21. The first connecting wire 322 of the first electronic unit 32 includes two first connecting wire sections 324 that are wound on the first winding core 321, that are respectively and electrically connected to the first protruding sections 342 of the first terminals 34, and that are electrically connected to the first end 371 of the first grounding terminal 37. The second connecting wire 323 of the first electronic unit 32 includes two second connecting wire sections 325 that are wound on the first winding core 321, that are respectively and electrically connected to the first sections 361 of the connecting terminals 36, and that are electrically connected to the first end 381 of the second grounding terminal 38. In this embodiment, the second end 372 of the first grounding terminal 37 and the second end 382 of the second grounding terminal 38 may be electrically connected to a circuit board (not shown) for achieving the function of grounding.

Figure 10:
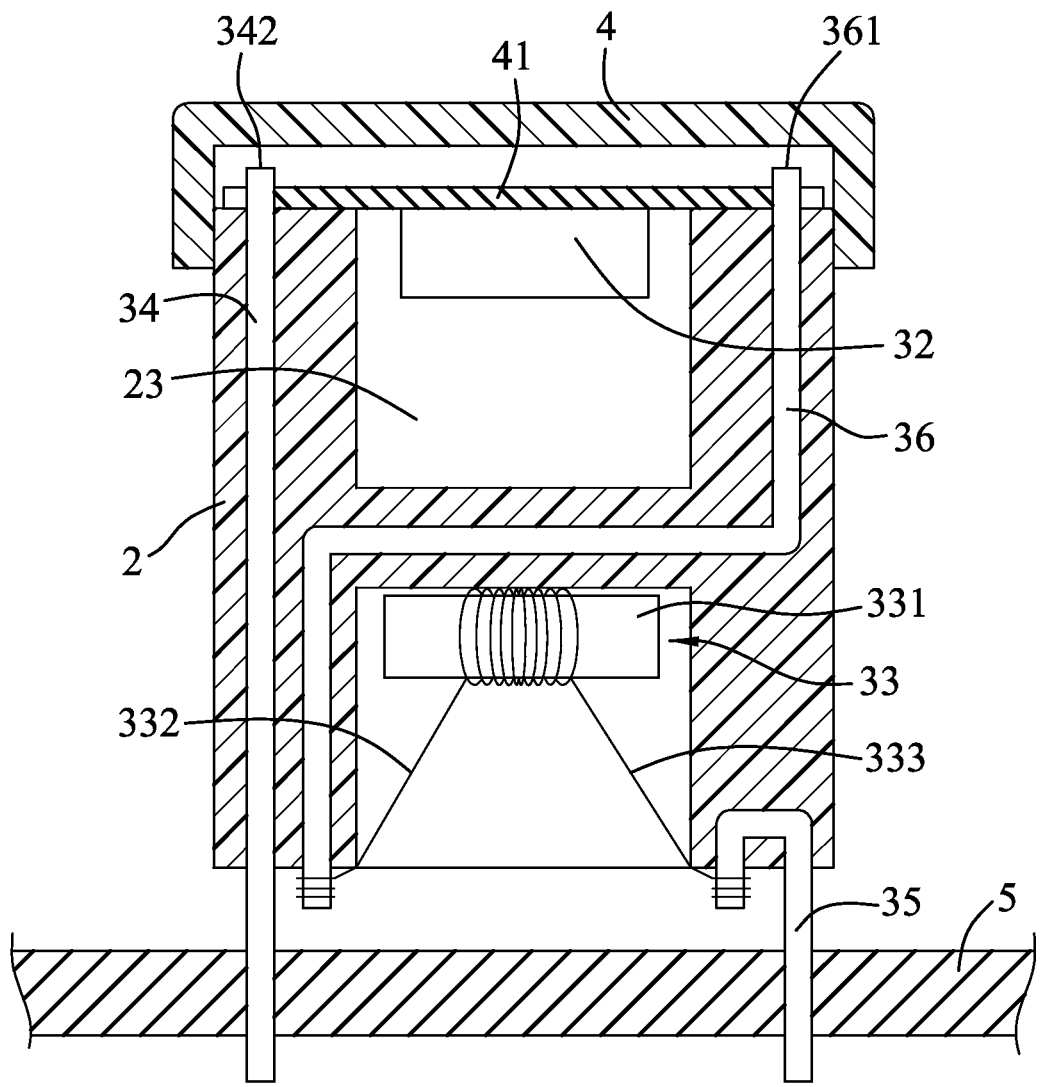
FIG. 10 is a partly sectional view of a fourth embodiment of the electronic apparatus according to the present disclosure, which i s mounted to the circuit board.

Referring to FIG. 10, a fourth embodiment of the electronic apparatus of the present disclosure has a structure similar to that of the first embodiment, with differences describe below. The fourth embodiment further includes a cover 4 that is disposed on the base 2, that covers the first receiving space 23, and that includes a circuit board 41. The circuit board 41 of the cover 4 faces the first receiving space 23, and is electrically connected to the first terminals 34 and the connecting terminals 36. The first electronic unit 32 is electrically mounted to the circuit board 41. The first electronic unit 32 of this embodiment maybe an electronic component, such as a wire wound CM choke, and may be changed according to practical requirements.

To sum up, since the first protruding sections 342 of the first terminals 34 and the first sections 361 of the connecting terminals 36 all protrude from the first end surface 213, such that the first protruding sections 342 protrude from the first surface region 215 and the first sections 361 protrude from the second surface region 216 of the first end surface 213, and since the second protruding sections 352 of the second terminals 35 and the second sections 362 of the connecting terminals 36 all protrude from the second wall surface 214, such that the second sections 362 protrude from the third surface region 217 and the second protruding sections 352 protrude from the fourth surface region 218 of the second wall surface 214, the user can easily connect each wire to a corresponding one of the terminals, thereby increasing manufacturing efficiency and reducing the possibility of incorrect connection.

In the description above, for the purposes of explanation, numerous specific details have been set forth in order to provide a thorough understanding of the embodiment (s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is (are) considered the exemplary embodiment(s), it is understood that this disclosure is not limited to the disclosed embodiment (s) but is intended to cover various arrangements included within the spirit and scope of the broadest interpretation so as to encompass all such modifications and equivalent arrangements.

What is claimed is:

1. An electronic apparatus comprising:
   a base that includes a surrounding wall and a separating wall connected to said surrounding wall, said surrounding wall and said separating wall cooperatively defining a first receiving space and a second receiving space that are spaced apart from each other by said separating wall, said surrounding wall having opposite first and second end surfaces that are formed with said first and second receiving spaces, respectively; and
   an electronic module that includes a terminal unit mounted to said base, a first electronic unit received in said first receiving space, and a second electronic unit received in said second receiving space, said terminal unit including two first terminals that are electrically connected to said first electronic unit, two second terminals that are electrically connected to said second electronic unit, and two connecting terminals that are mounted to said base, each of said connecting terminals having a first section that extends outwardly from said first end surface and that is electrically connected to said first electronic unit, a second section that extends outwardly from said second end surface and that is electrically connected to said second electronic unit, and an interconnecting section that is embedded within said base, that extends through said separating wall, and that interconnects said first section and said second section.

2. The electronic apparatus as claimed in claim 1, wherein said first end surface of said surrounding wall has a first surface region and a second surface region that are respectively located at opposite sides of said first receiving space, said second end surface of said surrounding wall having a third surface region and a fourth surface region that are respectively located at opposite sides of said second receiving space, said first surface region of said first end surface and said third surface region of said second end surface corresponding in position to each other along a thickness direction of said separating wall, said second surface region of said first end surface and said fourth surface region of said second end surface corresponding in position to each other along the thickness direction of said separating wall, said first section of each of said connecting terminals extending outwardly from said second surface region of said first end surface, said second section of each of said connecting terminals extending outwardly from said third surface region of said second end surface.

3. The electronic apparatus as claimed in claim 2, wherein:
    each of said first terminals has a first embedded section that is embedded within said surrounding wall, a first protruding section that is connected to said first embedded section and that extends outwardly from said first surface region of said first end surface, and a first inserting section that is connected to said first embedded section and that extends outwardly from said third surface region of said second end surface; and
    each of said second terminals has a second embedded section that is embedded within said surrounding wall, a second protruding section that is connected to said second embedded section and that extends outwardly from said fourth surface region of said second end surface, and a second inserting section that is connected to said second embedded section and that extends outwardly from said fourth surface region of said second end surface.

4. The electronic apparatus as claimed in claim 2, wherein:
    said surrounding wall further has an outer surrounding surface that extends perpendicularly from said first end surface to said second end surface and that interconnects said first end surface and said second end surface;
    each of said first terminals has a first embedded section that is embedded within said surrounding wall, a first protruding section that is connected to said first embedded section and that extends outwardly from said first surface region of said first end surface, and a first connecting section that is connected to said first embedded section and that extends outwardly from said outer surrounding surface of said surrounding wall; and
    each of said second terminals has a second embedded section that is embedded within said surrounding wall, a second protruding section that is connected to said second embedded section and that extends outwardly from said fourth surface region of said second end surface, and a second connecting section that is connected to said second embedded section and that extends outwardly from said outer surrounding surface of said surrounding wall.

5. The electronic apparatus as claimed in claim 2, wherein:
    said first electronic unit includes a first winding core, a first connecting wire that is wound on said first winding core and that is electrically connected to said first terminals, and a second connecting wire that is wound on said first winding core and that is electrically connected to said connecting terminals; and
    said second electronic unit includes a second winding core, a third connecting wire that is wound on said second winding core and that is electrically connected to one of said connecting terminals and one of said second terminals, and a fourth connecting wire that is wound on said second winding core and that is electrically connected to the other one of said connecting terminals and the other one of said second terminals.

6. The electronic apparatus as claimed in claim 5, wherein:
    said terminal unit further includes a first grounding terminal that extends outwardly from said first surface region of said first end surface, and a second grounding terminal that extends outwardly from said second surface region of said first end surface;
    said first connecting wire of said first electronic unit includes two first connecting wire sections that are wound on said first winding core, that are respectively and electrically connected to said first terminals, and that are electrically connected to said first grounding terminal; and
    said second connecting wire of said first electronic unit includes two second connecting wire sections that are wound on said first winding core, that are respectively and electrically connected to said connecting terminals, and that are electrically connected to said second grounding terminal.

7. The electronic apparatus as claimed in claim 2, further comprising a cover that is disposed on said base, that covers said first receiving space, and that includes a circuit board facing said first receiving space and electrically connected to said first terminals and said connecting terminals,
    wherein said first electronic unit is electrically mounted to said circuit board, and
    wherein said second electronic unit includes a second winding core, a third connecting wire that is wound on said second winding core and that is electrically connected to one of said connecting terminals and one of said second terminals, and a fourth connecting wire that is wound on said second winding core and that is electrically connected to the other one of said connecting terminals and the other one of said second terminals.

* * * * *